(12) United States Patent
Yang et al.

(10) Patent No.: US 12,501,553 B2
(45) Date of Patent: Dec. 16, 2025

(54) METHODS AND SYSTEMS FOR CONFIGURING CONDUCTIVE PATHS IN A PRINTED CIRCUIT BOARD ASSEMBLY (PCBA) FOR ENHANCED POWER DISTRIBUTION

(71) Applicant: PCB Automation Inc., Campbell, CA (US)

(72) Inventors: Zhiping Yang, Campbell, CA (US); Eddie Mok, Irvine, CA (US)

(73) Assignee: PCB Automation Inc., Campbell, CA (US)

( * ) Notice: Subject to any disclaimer, the term of this patent is extended or adjusted under 35 U.S.C. 154(b) by 0 days.

(21) Appl. No.: 19/261,489

(22) Filed: Jul. 7, 2025

(65) Prior Publication Data

US 2025/0338405 A1    Oct. 30, 2025

Related U.S. Application Data

(63) Continuation of application No. 19/066,088, filed on Feb. 27, 2025.
(Continued)

(51) Int. Cl.
    *H05K 3/10*     (2006.01)
    *H05K 1/11*     (2006.01)

(52) U.S. Cl.
    CPC .............. *H05K 3/10* (2013.01); *H05K 1/113* (2013.01); *H05K 2201/09227* (2013.01); *H05K 2201/09418* (2013.01); *H05K 2203/163* (2013.01)

(58) Field of Classification Search
    CPC .............. H05K 3/10; H05K 1/113; H05K 2201/09227; H05K 2201/09418
    (Continued)

(56) References Cited

U.S. PATENT DOCUMENTS 10,231,325 B1    3/2019    Chengson
11,006,523 B1    5/2021    Vinciarelli
(Continued)

FOREIGN PATENT DOCUMENTS

TW    201114338    4/2011

OTHER PUBLICATIONS

Author Unknown, II. Plasma Package, Packaging Benchmark Suite, 2022.
(Continued)

*Primary Examiner* — Andargie M Aychillhum
(74) *Attorney, Agent, or Firm* — Van Pelt, Yi & James LLP

(57) ABSTRACT

A PCBA that includes a bare PCB comprising copper layers and dielectric layers is obtained. A connected PCBA is generated using the bare PCB, including by positioning voltage supply terminals and ground terminals that are associated with supplying power to circuit board components. Component pads are positioned, where each is electrically connected to either at least one voltage supply terminal or at least one ground terminal, but not to both. Conductive paths are configured, based at least in part on via-to-via spacing rules, including at least one voltage supply conductive path, at least one ground conductive path, and at least one data conductive path associated with data communication. Each of the circuit board components is electrically connected to at least some of the plurality of component pads, via at least some of the set of voltage supply terminals and via at least some of the set of ground terminals.

20 Claims, 12 Drawing Sheets

Related U.S. Application Data

(60) Provisional application No. 63/560,626, filed on Mar. 1, 2024.

(58) Field of Classification Search
USPC .......................................................... 174/250
See application file for complete search history.

(56) References Cited

U.S. PATENT DOCUMENTS

| | | |
|---|---|---|
| 11,277,918 B2 | 3/2022 | Sabavat |
| 2006/0278331 A1 | 12/2006 | Dugas |
| 2016/0120040 A1* | 4/2016 | Elmieh .................. H05K 3/101 |
| | | 700/98 |
| 2017/0265312 A1 | 9/2017 | Hu |
| 2019/0210067 A1* | 7/2019 | Kumar .................. G06V 10/82 |
| 2022/0254708 A1 | 8/2022 | Hu |
| 2024/0063158 A1 | 2/2024 | Singh |
| 2025/0081348 A1 | 3/2025 | Rajasekar |

OTHER PUBLICATIONS

Author Unknown, Packaging Benchmarks, Packaging Benchmark Suite, 2022.
Author Unknown, Plasma Package Benchmark Problem, 2022.
Barnes et al., The IEEE EPS Packaging Benchmark Suite, IEEE EPS EDMS Packaging Benchmark Suite 2022, 2022.

* cited by examiner

METHODS AND SYSTEMS FOR CONFIGURING CONDUCTIVE PATHS IN A PRINTED CIRCUIT BOARD ASSEMBLY (PCBA) FOR ENHANCED POWER DISTRIBUTION

CROSS REFERENCE TO OTHER APPLICATIONS

This application is a continuation of U.S. patent application Ser. No. 19/066,088 entitled METHODS AND SYSTEMS FOR CONFIGURING CONDUCTIVE PATHS IN A PRINTED CIRCUIT BOARD ASSEMBLY (PCBA) FOR ENHANCED POWER DISTRIBUTION filed Feb. 27, 2025, which claims priority to U.S. Provisional Application No. 63/560,626 entitled SYSTEM AND METHOD FOR DESIGNING AND MANUFACTURING A PRINTED CIRCUIT BOARD WITH AN ENHANCED VERTICAL POWER DISTRIBUTION NETWORK filed Mar. 1, 2024, each of which is incorporated herein by reference for all purposes.

TECHNICAL FIELD

The present disclosure relates to printed circuit board (PCB) designing and manufacturing techniques, and more particularly to methods and systems for configuring conductive paths in a Printed Circuit Board assembly (PCBA) with enhanced vertical power distribution.

BACKGROUND

Generally, an assembled printed circuit board (PCBA) 100 in FIG. 1 includes a bare printed circuit board (PCB) 110 and various discrete and active components assembled on the assembled PCBA 100 (hereinafter interchangeably referred to as 'the PCBA 100'). The circuit board components may include complex integrated circuit (IC) devices 101 (e.g., processors, memories, Application Specific Integrated Circuits (ASICs)), Area Array Package (AAP) 102, DC/DC converters 103 (e.g., direct current (DC)-to-direct current (DC) converters, switching power suppliers, and/or Low Dropout (LDO) power suppliers), and discrete components 104 (e.g., resistors, capacitors, and the like).

In recent times, complex IC device technologies have evolved to produce higher performances. Further, the IC devices generated using the complex IC device technologies may include many advanced circuit components (such as GPU, CPU, TPU, memory, high-speed transceivers, etc.) with faster signal edges and higher clock rates. Thus, using a higher number of advanced circuit components on the bare PCB 110 (hereinafter interchangeably referred to as 'the PCB 110') offer increased functionality. However, the PCB 110 with many advanced IC components faces the increasing difficulty of routing high-speed signals and avoiding interference. Further, the PCB using the complex IC technologies tends to consume more power to perform various functions. Also, more circuit board components in the PCB generate additional heat, complicating thermal management and potentially reducing the lifespan of the PCB. The total power consumption of the PCB is an important factor for operation costs. One part of the power loss is from the power distribution networks (PDN) between the DC-DC converters and the IC dies. The power losses from the PDN networks can be quite large for high-current applications. As a result, PCB manufacturers may focus on reducing the current carrying density to reduce the power loss in the form of heat loss by increasing the copper area (i.e., dedicated power and ground layers, thicker copper planes with more copper, increasing power trace/plane, or plate thicker copper in the plated through hole (PTH), etc.) to the IC devices being manufactured using the complex IC technologies.

Referring to FIG. 2A, the assembled printed circuit board (PCBA) or the PCBA 100 configured using the conventional power delivery network (PDN) following standard PCB design approaches is shown. In general, the PCB 110 provides both electrical and mechanical connections for other components such as ICs, decoupling capacitors, resistors, inductors, connectors, etc. The decoupling capacitors, the resistors, and the inductors may be collectively referred to as 'the discrete components 104'. In an embodiment, the PCB 110 may be a multi-layer PCB board. The multi-layer PCB may include horizontal groundplane(s) 114, powerplane(s) 113, signal traces on copper layers, horizontal dielectric layers 115, and an array of vertically plated-through-hole (PTH) vias 112 interconnecting the internal multi-layers to the surface mount pads 111, etc. The surface mount pads 111 are then connected to the ICs, DC converters, or other components by solder balls or pins (see, 105). The solder balls 105 may include power pins, ground pins, signal pins, and the like. Hence, the term 'solder balls 105' is interchangeably referred to as 'the ground pins 105' or 'the power pins 105' as per the requirements for the power and ground pins. To simplify PCB design and manufacturing, PCB designers usually assign different copper layers as signal layers, power layers, and ground layers based on their functions.

The conventional PDN approaches to providing power supply signals (hereinafter interchangeably referred to as "the conventional power distribution approach") involve installing the direct current (DC)/direct current (DC) converters 103 and the Area Array Package (AAP) devices 102 on a top side 110a of the PCB 110. The DC/DC converters 103 may be configured to convert a DC input voltage from one level (such as 48 Volt or 12 Volt) to another level (such as 1V or 0.9V). The DC/DC converters 103 may be a single chip, a module with multiple components, or a group of components. Further, the PCB 110 typically includes the array of vertically plated-through-hole (PTH) vias 112 (hereinafter interchangeably referred to as 'the PTH vias 112') which connect conductive features (e.g., data lines, the power planes 113, the ground planes 114, etc.) within the PCB 110 to the surface mount pads 111 electrically connected to the AAP devices 102 and/or the DC/DC converters 103. Furthermore, the PCB 110 includes a bottom side 110b which is opposite to the mounting locations of the AAP devices 102 (as shown in FIG. 2A). The PCB 110 may include the discrete components 104 such as decoupling capacitors (as shown in FIG. 2A). The decoupling capacitors (i.e., the discrete components 104) may be electrically connected to the bottom side 110 band/or the top side 110a of the PCB 110. This ensures minimizing loop inductance from the decoupling capacitors to the AAP devices 102. The PCB 110 may further include at least one integrated circuit (IC) 101 coupled to the AAP devices 102. In this configuration, the DC current flow path in the PCBA 100 is as follows:

the power pins 105 of the DC/DC converters 103→flowing through the associated power pads 111→flowing vertically through the PTH vias 112 associated with the power pins 105 of the DC/DC converters 103→flowing horizontally through the power planes 113→flowing vertically through the PTH vias 112 associated with the power pins 105 of the AAP devices 102→flowing through the associated power pads 111→the power pins 105 associated with the AAP devices 102→flowing through the IC101→ground pins associated with the AAP devices 102→flowing through the associated surface mount pads 111→flowing Vertically through the PTH vias 112 associated with ground pins of the AAP devices 102→flowing Horizontally through the ground planes 114→flowing Vertically through the PTH vias 112 associated with ground pins of the DC/DC converters 103→flowing through the associated surface mount pads 111→the ground pins 105 of the DC/DC converters 103.

Thus, the current flows from the DC/DC contact pin (i.e., the power pins 105) both vertically through the surface mount pads 111 and PTH vias 112 and horizontally through the power planes 113 and the ground planes 114 within the PCB 110 (as shown in FIG. 2A). To reduce the power losses from horizontal current paths, designers traditionally use more Power/Ground layers (such as the power planes 113 and the ground planes 114) and/or increase the copper thickness of the power/ground planes. The power losses from the vertical current paths are usually difficult to control since the PTH vias 112 are determined by the power/ground pins of the AAP devices 102. However, increasing the number of power/ground pins associated with the AAP devices 102 incurs higher fabrication costs. In some cases, the designers may use a smaller package pin pitch or pattern to increase the number of power/ground pins associated with the AAP devices 102 which is undesirable and increases the complexity and cost of the PCBA 100. In standard PCB design guidelines, the ratio between the number of power/ground pins and the associated PTH vias 112 is one-to-one (i.e., one via assigned to one power/ground pin). To mitigate the challenges associated with the conventional PDN approaches with horizontal and vertical current paths, a recent approach to providing the high-current power supply signals to the IC 101 through the AAP devices 102 is implemented which will be explained with reference to FIG. 2B.

Referring to FIG. 2B, the recent approach (hereinafter interchangeably referred to as 'the vertical power distribution approach') to providing the high-current power supply signals to the IC device 101 involves installing the DC/DC converters 103 and the AAP devices 102 on the opposite sides of the PCB 110. For example, the AAP devices 102 are placed on the top side 110a of the PCB 110, and decoupling capacitors can be integrated into the DC/DC converters 103, the PCB 110, and/or the AAP 102. In this configuration, the DC current flow vertically in the PCB 110 is as follows:

the power pins 105 associated with the DC/DC converters 103→flowing through the associated DC/DC converter surface mount pads 111→flowing vertically through the PTH vias 112 associated with the power pins 105 shared between the DC/DC converters 103 and the AAP devices 102→flowing through the associated AAP surface mount pads 111→the power pins 105 associated with the AAP devices 102→flowing through the IC 101→the ground pins 105 associated with the AAP devices 102→flowing through the associated AAP surface mount pads 111→flowing vertically through the PTH vias 112 associated with the ground pins 105 shared between the DC/DC converters 103 and the AAP devices 102→flowing through the associated DC/DC converters surface mount pads 111→the ground pins associated with the DC/DC converters 103.

As shown in FIG. 2B, the configuration of the PCB 110 significantly reduces the horizontal current flow path over the power planes 113 and the ground planes 114. In both the configurations disclosed in FIGS. 2A and 2B, a standard PCB guideline for the number of power/ground surface mount pads 111 or power/ground pins 105 and the associated PTH vias 112 are 1:1, so the PTH vias 112 becomes the bottleneck for the vertical current flows. To decrease the vertical current density by increasing the number of the PTH vias 112 in high-current areas, designers conventionally may use different pin patterns without increasing the footprint area, increase the package size to increase the number of power and ground pins, request PCB fabricator to plate thicker copper in the via than nominal, and the like. As a result, the conditioning effects of the above-described approaches are limited or require a costly reconfiguration of the ground and power pins and AAP packages.

Further, the standard PCB guideline approaches are disclosed in FIGS. 2A and 2B generally implement the same design and manufacturing 1 surface mount pad&pin-to-1 PTH rules for all signals (such as digital signals, analog signals, power signals, and ground signals) on the PCB 110. It is to be noted that the designers are focused on the digital and analog signals which usually require one PTH via per component pad&pin. However, for the digital and analog signals, if one PTH via fails for open or short failure, the entire functionality of the PCB 110 fails.

Therefore, there is a need to expand the standard PCB guideline to increase the vertical conductive area with minimum design changes, and minimum impact to manufacturing cost by enhancing vertical power distribution to overcome the aforementioned limitations, in addition to providing other technical advantages.

SUMMARY

Various embodiments of the present disclosure disclose methods and systems for configuring conductive paths in a Printed Circuit Board assembly (PCBA) with enhanced vertical power distribution.

In an embodiment, a method for configuring conductive paths in a printed circuit board assembly (PCBA) is disclosed. The method includes obtaining the printed circuit board assembly (PCBA) including a bare printed circuit board (PCB) which includes copper layers and dielectric layers, and a set of first terminals and a set of second terminals configured on the bare PCB for allowing electrical coupling of a plurality of circuit board components. Further, the method includes positioning a plurality of component pads on the bare PCB. The plurality of component pads is electrically connected to the set of first terminals and the set of second terminals. The method further includes configuring at least one conductive path for at least each first terminal of the set of first terminals and for each second terminal of the set of second terminals. The at least one conductive path are configured for at least each first terminal of the set of first terminals and each second terminal of the set of second terminals based at least on applying a set of spacing rules. Further, each component pad of the plurality of component pads is electrically connected to a corresponding conductive path of the at least one conductive path associated with at least each first terminal of the set of first terminals and each second terminal of the set of second terminals. The plurality of circuit board components is electrically connected to the plurality of component pads of the PCB.

In another embodiment, a printed circuit board assembly (PCBA) is disclosed. The PCBA includes a bare printed circuit board (PCB) which includes copper layers and dielectric layers and a set of first terminals and a set of second terminals configured on the bare PCB to allow electrical coupling of a plurality of circuit board components. Further, the PCB includes a plurality of component pads configured on the bare PCB. The plurality of component pads is electrically connected to the set of first terminals and the set of second terminals. The PCB further includes at least one conductive path configured for at least each first terminal of the set of first terminals and each second terminal of the set of second terminals. The at least one conductive path is configured for at least each first terminal of the set of first terminals and each second terminal of the set of second terminals based at least on applying a set of spacing rules. Further, each component pad of the plurality of component pads is electrically connected to a corresponding conductive path of the at least one conductive path associated with at least each first terminal of the set of first terminals and each second terminal of the set of second terminals. The plurality of circuit board components is electrically connected to the plurality of component pads of the bare PCB.

In yet another embodiment, a method for configuring conductive paths is disclosed. The method includes obtaining a printed circuit board assembly (PCBA). The PCBA includes a bare printed circuit board (PCB) which includes copper layers and dielectric layers and a set of first terminals and a set of second terminals configured on the bare PCB for allowing electrical coupling of a plurality of circuit board components. Further, the method includes positioning a plurality of component pads on the bare PCB. The plurality of component pads is electrically connected to the set of first terminals and the set of second terminals. The method further includes configuring at least one conductive path for at least each first terminal of the set of first terminals and for each second terminal of the set of second terminals. The at least one conductive path is configured for at least each first terminal of the set of first terminals and each second terminal of the set of second terminals based at least on applying a set of spacing rules. Further, each component pad of the plurality of component pads is electrically connected to a corresponding conductive path of the at least one conductive path associated with at least each first terminal of the set of first terminals and each second terminal of the set of second terminals. Further, configuring the at least one conductive path includes configuring a primary conductive path of the at least one conductive path in the bare PCB. The primary conductive path is electrically coupled to a corresponding first terminal of the set of first terminals and a corresponding second terminal of the set of second terminals through the plurality of component pads. Furthermore, configuring the at least one conductive path includes configuring at least one secondary conductive path of the at least one conductive path in the bare PCB. The at least one secondary conductive path is electrically coupled to the corresponding first terminal of the set of first terminals and the corresponding second terminal of the set of second terminals through the plurality of component pads and a conductive feature. The plurality of circuit board components is electrically connected to the plurality of component pads of the bare PCB.

BRIEF DESCRIPTION OF THE DRAWINGS

The following detailed description of illustrative embodiments is better understood when read in conjunction with the appended drawings. To illustrate the present disclosure, exemplary constructions of the disclosure are shown in the drawings. However, the present disclosure is not limited to a specific device or a tool and instrumentalities disclosed herein. Moreover, those in the art will understand that the drawings are not to scale. Wherever possible, like elements have been indicated by identical numbers.

DETAILED DESCRIPTION

In the following description, for purposes of explanation, numerous specific details are set forth in order to provide a thorough understanding of the present disclosure. It will be apparent, however, to one skilled in the art that the present disclosure can be practiced without these specific details. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

Reference in this specification to "one embodiment" or "an embodiment" means that a particular feature, structure, or characteristic described in connection with the embodiment is included in at least one embodiment of the present disclosure. The appearance of the phrase "in one embodiment" in various places in the specification does not necessarily refer to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

Moreover, although the following description contains many specifics for the purposes of illustration, anyone skilled in the art will appreciate that many variations and/or alterations to said details are within the scope of the present disclosure. Similarly, although many of the features of the present disclosure are described in terms of each other, or in conjunction with each other, one skilled in the art will appreciate that many of these features can be provided independently of other features. Accordingly, this description of the present disclosure is set forth without any loss of generality to, and without imposing limitations upon, the present disclosure.

Various example embodiments of the present disclosure are described hereinafter with reference to FIGS. 3A-3E to FIG. 7.

Figure 3A:
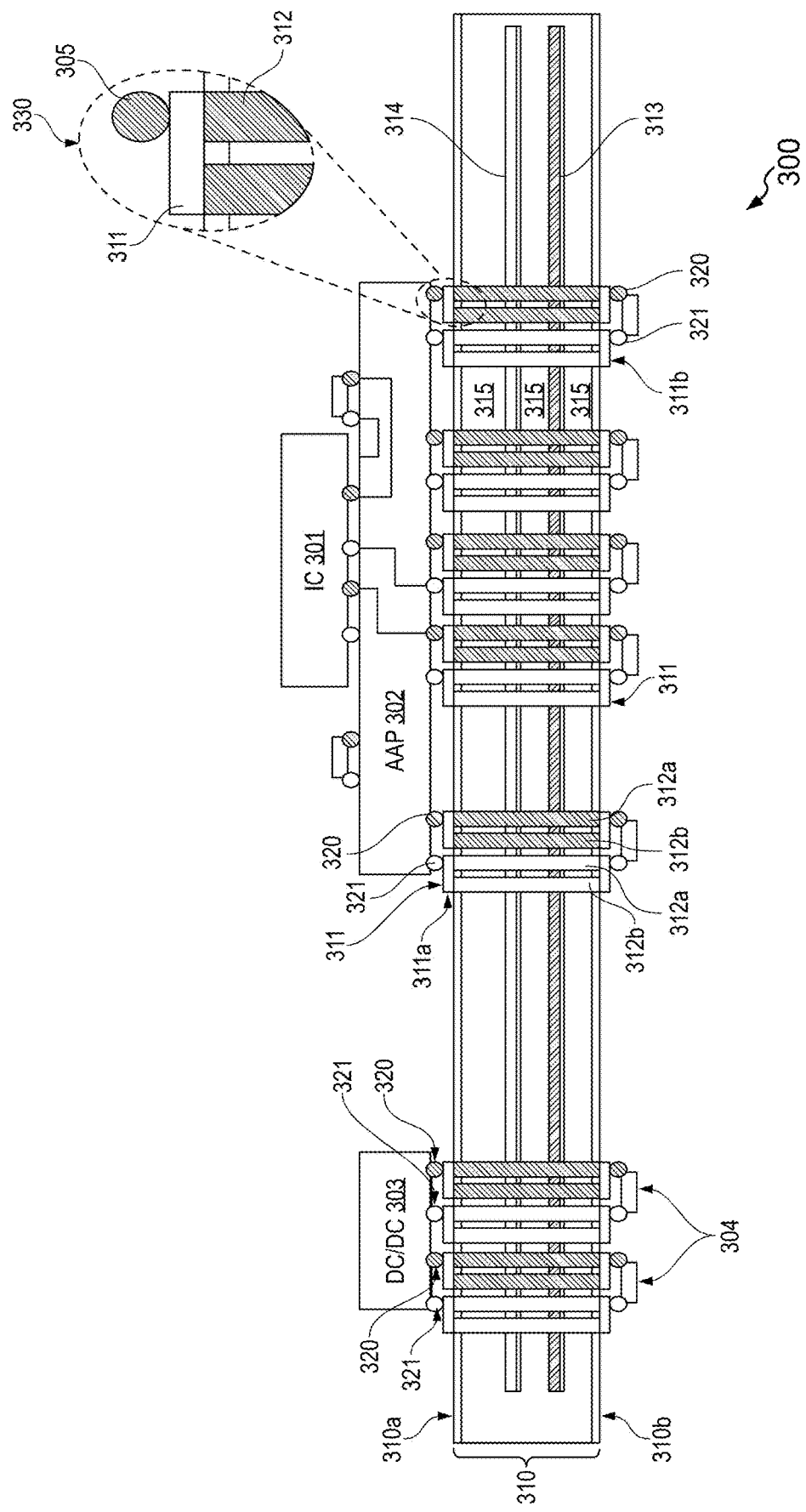
FIG. 3A illustrates a schematic representation of a printed circuit board assembly (PCBA) using the conventional power distribution network (PDN) following PCB design guideline approaches, in accordance with an embodiment of the present disclosure.

FIG. 3A illustrates a schematic representation of an assembled printed circuit board (PCBA) 300, in accordance with an embodiment of the present disclosure. The PCBA 300 includes a bare PCB 310. The PCB 310 includes a top surface 310a and a bottom surface 310b. The PCB 310 further includes a set of first terminals 320 and a set of second terminals 321. The set of first terminals 320 may be power pins in the PCBA 300 in the bare PCB 310 (hereinafter interchangeably referred to as 'the PCB 310'). For illustration purposes, the set of first terminals 320 is represented using a circle provided with a hatching pattern, and the set of second terminals 321 is represented using a white circle. Some examples of the AAP devices 302 may include Ball Grid Array (BGA) devices and Ceramic Column Grid Array Package (CCGA) devices. The set of first terminals 320 is electrically connected to at least one power plane 313 in the PCB 310 for voltage supply (e.g., VDD, VCC). The set of second terminals 321 may be ground pins in the PCB 310. The set of second terminals 321 is electrically connected to at least one ground plane 314 of the PCB 310. The at least one power plane 313 and the at least one ground plane 314 are collectively referred to as copper layers configured in the PCB 310. Further, the PCB 310 is configured with dielectric layers 315 between the copper layers (or the power plane 313 and the ground plane 314). Additionally, or alternatively, the PCB 310 may include a set of third terminals (which is not shown in FIG. 3A). The set of third terminals may be signal pins used for data communication in the PCBA 300.

Figure 4A:
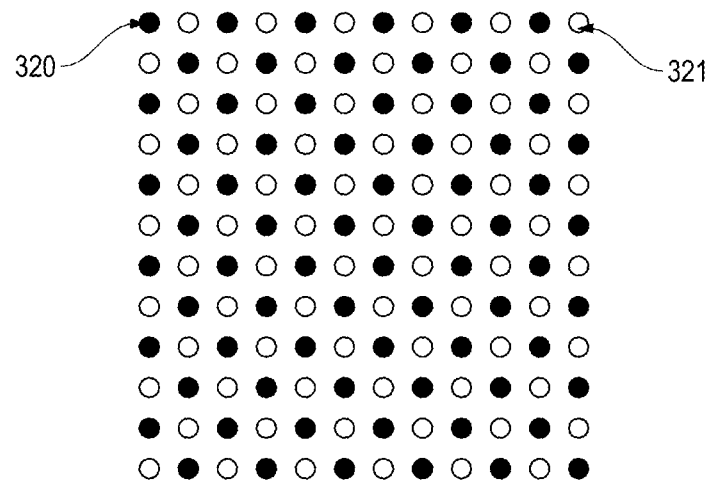
FIG. 4A illustrates a schematic representation of a set of first terminals and a set of second terminals of the bare printed circuit board (PCB) arranged in a square pattern, in accordance with an embodiment of the present disclosure.
Figure 4B:
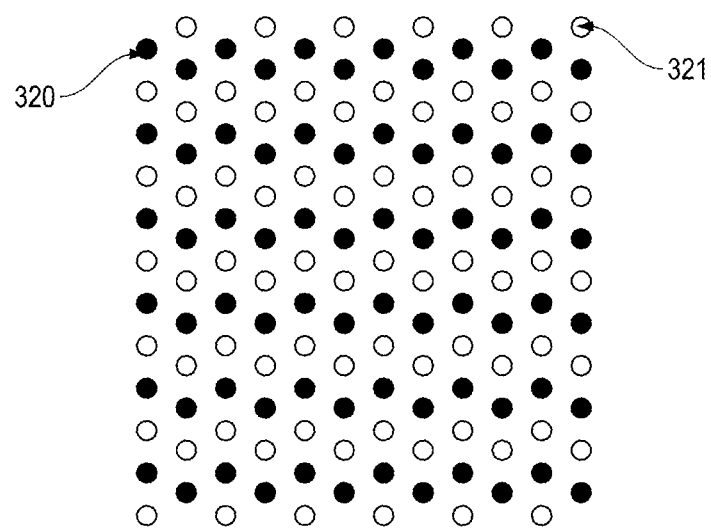
FIG. 4B illustrates a schematic representation of the set of first terminals and the set of second terminals of the bare printed circuit board (PCB) arranged in a hexagon pattern, in accordance with an embodiment of the present disclosure.
Figure 4C:
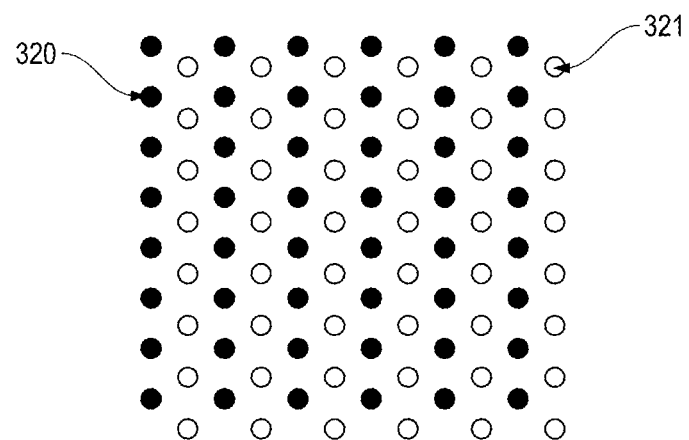
FIG. 4C illustrates a schematic representation of the set of first terminals and the set of second terminals of the bare printed circuit board (PCB) arranged in a diamond pattern, in accordance with an embodiment of the present disclosure.

In an embodiment, the set of first terminals 320 and the set of second terminals 321 are configured on the PCB 310 in a square pattern (as shown in FIG. 4A). In other words, the set of first terminals 320 and the set of second terminals 321 are arranged in a checkerboard-like pattern within the PCB 310. In another embodiment, the set of first terminals 320 and the set of second terminals 321 are configured on the PCB 310 in a hexagon pattern (as shown in FIG. 4B). In this configuration, each first terminal of the set of first terminals 320 and each second terminal of the set of second terminals 321 are surrounded by six neighboring terminals, forming a hexagonal layout (or a honeycomb-like structure). In another embodiment, the set of first terminals 320 and the set of second terminals 321 are configured on the PCB 310 in a diamond pattern. In this configuration, the set of first terminals 320 and the set of second terminals 321 are arranged in a diagonal grid structure (as shown in FIG. 4C). In other words, the set of first terminals 320 and the set of second terminals 321 are aligned along diagonals rather than the typical rows and columns of a square or rectangular grid. For illustration purposes, the set of first terminals 320 is shown as white circles and the set of second terminals 321 is shown as black circles in FIGS. 4A, 4B, and 4C. However, the set of first terminals 320 and the set of second terminals 321 may be represented using any other assignment patterns, therefore it should not be considered to limit the scope of the present disclosure.

Further, the PCB 310 includes a plurality of component pads 311. The plurality of top component pads 311 may be configured on the top surface 310a and the bottom surface 310b of the PCB 310. The plurality of component pads 311 is electrically connected to the set of first terminals 320 and the set of second terminals 321. The plurality of component pads 311 may be made of copper or any other conductive material as per design feasibility and requirements. The plurality of component pads 311 configured on the top surface 310a of the PCB 310 corresponds to a set of top component pads 311a. The plurality of component pads 311 configured on the bottom surface 310b of the PCB 310 corresponds to a set of bottom component pads 311b.

Further, the PCBA 300 may include a plurality of circuit board components, such as at least one integrated circuit (IC) 301, area array package (AAP) devices 302, power modules 303 (e.g., DC/DC converters), discrete components 304, sockets and connectors (not shown in FIGS.). The plurality of circuit board components is electrically connected to the plurality of component pads 311 of the PCB 310. In particular, the plurality of circuit board components is electrically connected in the printed circuit board system (PCBA) 300 through at least the set of top component pads 311a and the set of bottom component pads 311b. The AAP devices 302 are generally soldered to the set of top component pads 311a. The power modules 303 may include, but not limited to, DC/DC converters, power field effect transistors (FET), capacitors, resistors, inductors, power controllers, etc. The DC/DC converters may be configured to convert a DC input voltage from one level (such as 48 Volt or 12 Volt) to another level (such as 1V or 0.9V). The DC/DC converters may be a single chip, a module with multiple components, or a group of components. The power modules 303 are electrically connected to the set of top component pads 311a (in FIG. 3A) and the set of bottom component pads 311b (in FIG. 3B). Further, decoupling capacitors may be electrically connected to the set of top component pads 311a and/or the set of bottom component pads 311b.

The PCB 310 includes at least one conductive path 312 for each first terminal of the set of first terminals 320 and each second terminal of the set of second terminals 321. The at least one conductive path 312 (also referred to as 'the at least one vertical conductive path 312') corresponds to plated-through-hole (PTH) vias. The plated through-hole (PTH) vias are a type of vias used in the PCB 310 to electrically and thermally connect different copper layers (such as the power plane 313 and the ground plane 314) of the PCB 310. The at least one conductive path 312 is configured by drilling a hole through the copper layers of the PCB 310 and then electroplating with a conductive material (e.g., copper) to establish a reliable electrical connection.

The at least one conductive path 312 is configured for each first terminal of the set of first terminals 320 and each second terminal of the set of second terminals 321 based at least on applying a set of spacing rules which will be explained further in detail. As shown, each component pad of the plurality of component pads 311 is electrically connected to a corresponding conductive path of the at least one conductive path 312 associated with each first terminal of the set of first terminals 320 and each second terminal of the set of second terminals 321. In this configuration, only two conductive paths are defined for each first terminal and each second terminal. In another configuration, three or more conductive paths may be defined for each first terminal and each second terminal.

Figure 3B:
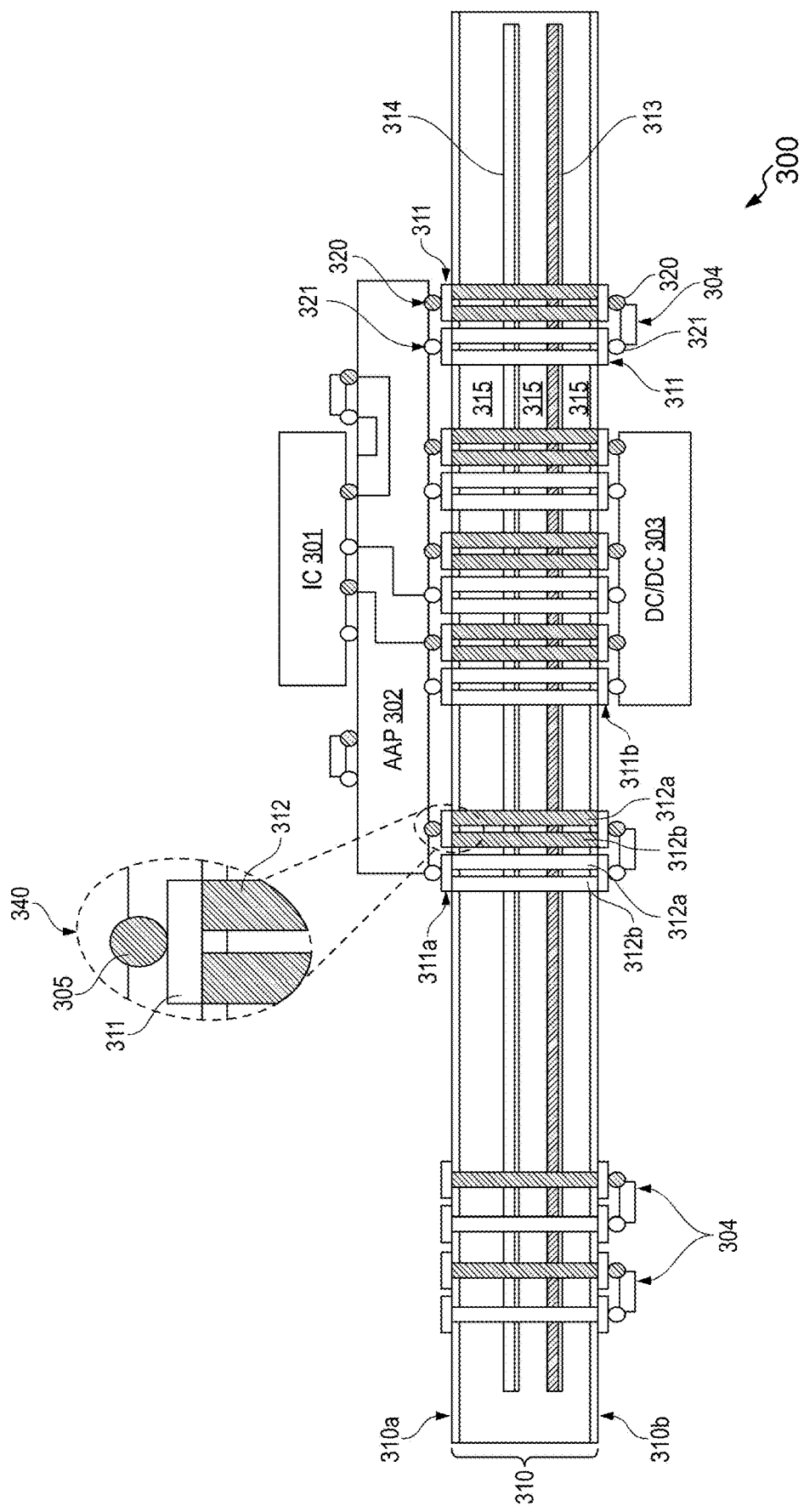
FIG. 3B illustrates a schematic representation of the printed circuit board assembly (PCBA) using the vertical power distribution network (PDN) following the PCB design guideline approaches, in accordance with an embodiment of the present disclosure.

As shown in FIGS. 3A and 3B. the at least one vertical conductive path 312 include a primary conductive path 312a and at least one secondary conductive path 312b. The primary conductive path 312a is electrically coupled to a corresponding first terminal of the set of first terminals 320 and a corresponding second terminal of the set of second terminals 321. Further, the at least one secondary conductive path 312b is electrically coupled to the corresponding first terminal of the set of first terminals 320 and the corresponding second terminal of the set of second terminals 321 through a conductive feature.

In one implementation, each component pad of the plurality of component pads 311 is electrically connected to the corresponding vertical conductive path of the at least one conductive path 312 associated with each first terminal of the set of first terminals 320 and each second terminal of the set of second terminals 321 through a via-in-pad configuration (as shown in FIG. 3A). In other words, the vertical conductive path (see, 312 of an enlarged portion 330 in FIG. 3A) of the at least one conductive path 312 is placed directly on a component pad (see, 311 of the enlarged portion 330 in FIG. 3A) of the plurality of component pads 311. This enables the direct connection of the at least one conductive path 312 with a first terminal (see, 305 of the enlarged portion 330 in FIG. 3A) of the set of first terminals 320 associated with the at least one conductive path 312. Similarly, the at least one conductive path 312 is electrically connected to the set of second terminals 321 in the via-in pad configuration.

In another implementation, each component pad of the plurality of component pads 311 is electrically connected to the corresponding vertical conductive path of the at least one conductive path 312 associated with each first terminal of the set of first terminals 320 and each second terminal of the set of second terminals 321 through a dog-bone fan-out configuration (as shown in FIG. 3B). In other words, the at least one conductive path 312 is placed at a distance from the first terminal (see, 305 of an enlarged portion 340 in FIG. 3B). The at least one conductive path 312 is electrically connected to the corresponding component pad (see, 311 of the enlarged portion 340 in FIG. 3B) of the plurality of component pads 311. This enables the direct connection of the conductive path 312 with the first terminal 305 of the set of first terminals 320 associated with the at least one conductive path 312. Similarly, the at least one conductive path 312 is electrically connected to the set of second terminals 321 in the dog-bone fan-out configuration.

Figure 3C:
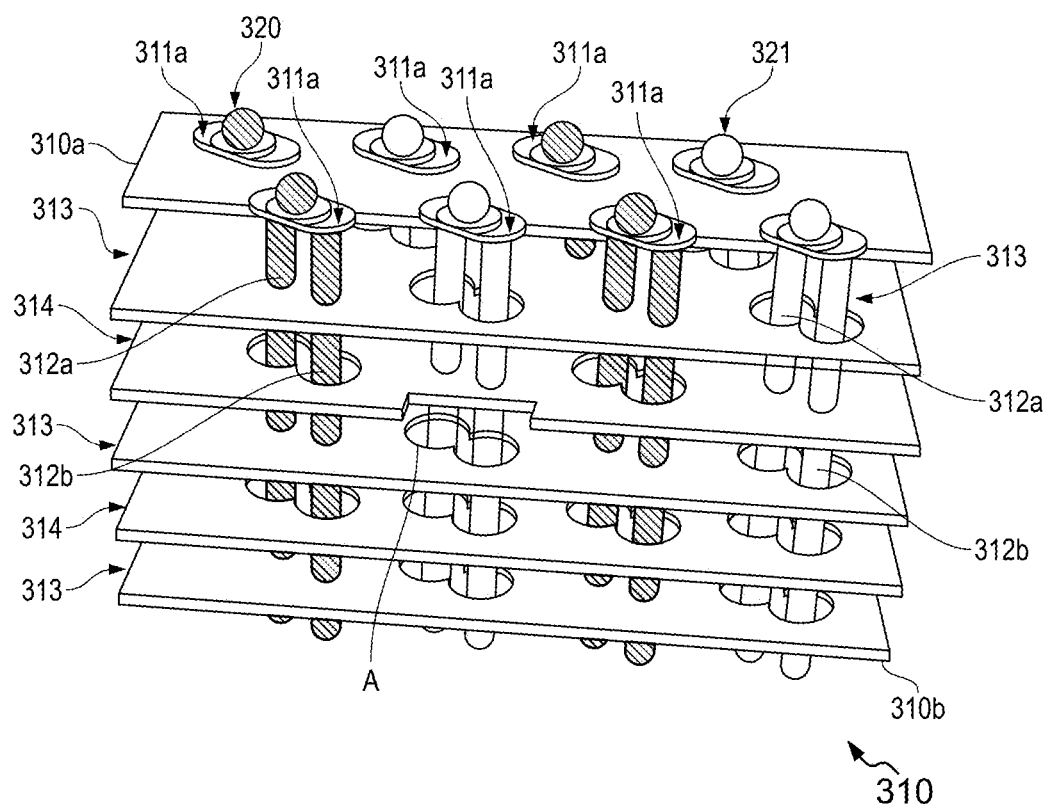
FIG. 3C illustrates a perspective view of the printed circuit board assembly (PCBA) of FIGS. 3A and 3B.
Figure 3D:
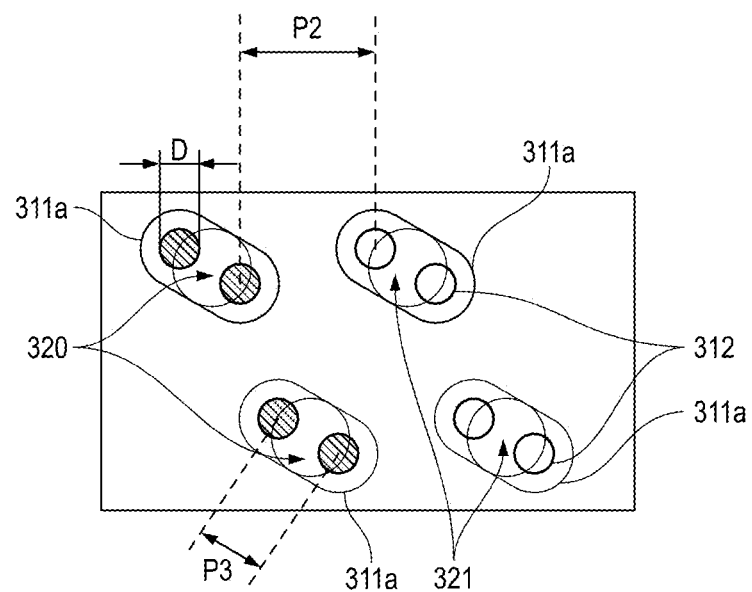
FIG. 3D illustrates a top view schematic representation of a drill hole size (DHS) of at least one conductive path of the printed circuit board assembly (PCBA) of FIGS. 3A and 3B.
Figure 3E:
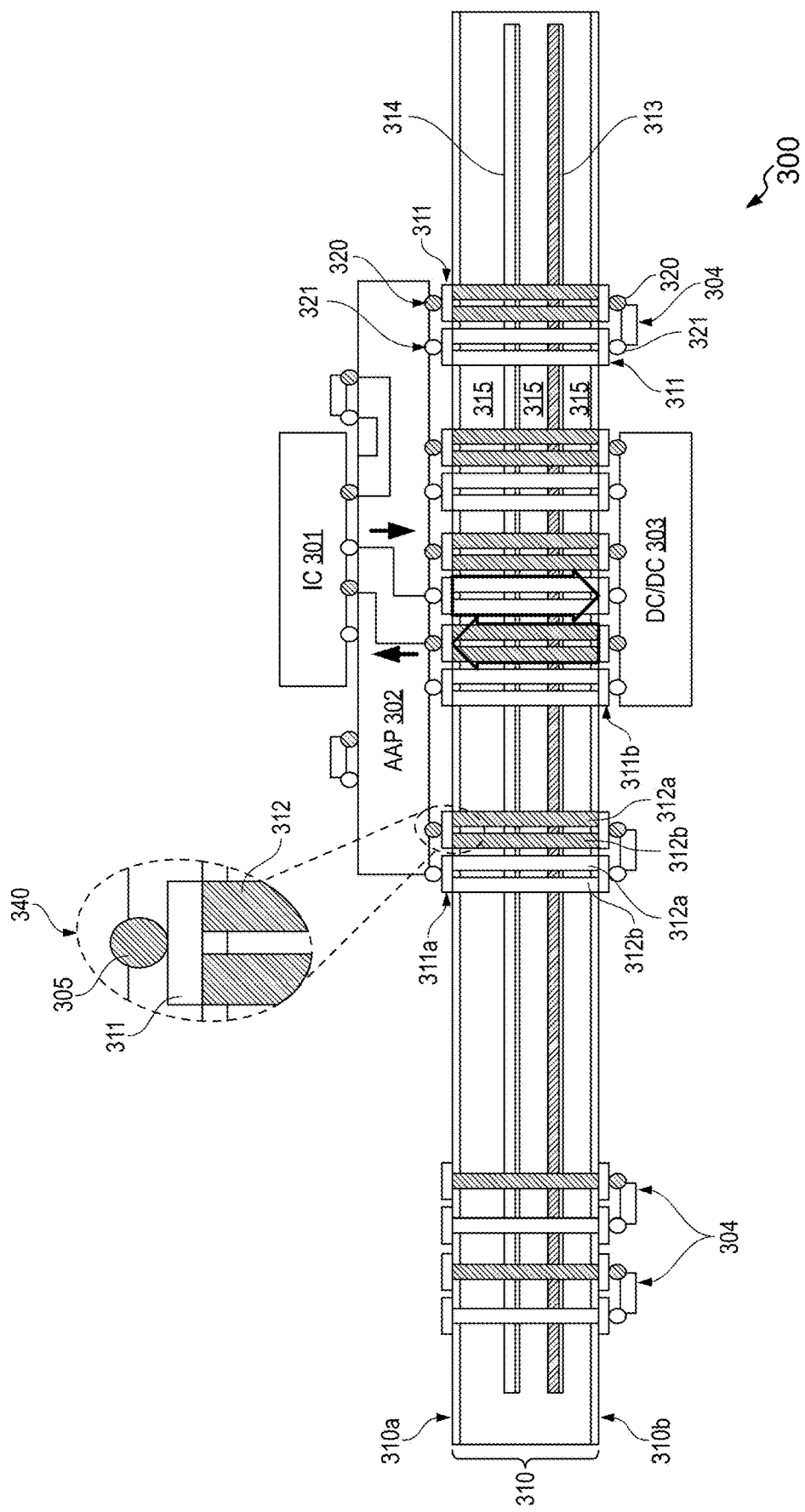
FIG. 3E illustrates a schematic representation of the printed circuit board assembly (PCBA) of FIG. 3B depicting current distribution in a bare PCB, in accordance with an embodiment of the present disclosure.

Referring to FIG. 3E in conjunction with FIG. 3B, to provide the high-current power supply signals to the IC device (i.e., the AAP devices 302) involve installing the DC/DC converters 303 on the opposite side of the AAP devices 302 in the PCBA 300 (as shown in FIG. 3B). In this configuration, the DC current flow in the PCB 310 is as follows:

the set of first terminals 320 associated with the DC/DC converters (i.e., the power modules 303)→flowing vertically through the set of first terminals 320 associated with the at least one conductive path 312 shared between the DC/DC converters (i.e., the power modules 303) and the AAP devices 302→the set of first terminals 320 associated with the AAP devices 302→flowing through the IC 301→the set of second terminals 321 associated with the AAP devices 302→flowing vertically through the set of second terminals 321 associated with the at least one conductive path 312 shared between the DC/DC converters (i.e., the power modules 303) and the AAP devices 302→the set of second terminals 321 associated with the DC/DC converters (i.e., the power modules 303).

Figure 1:
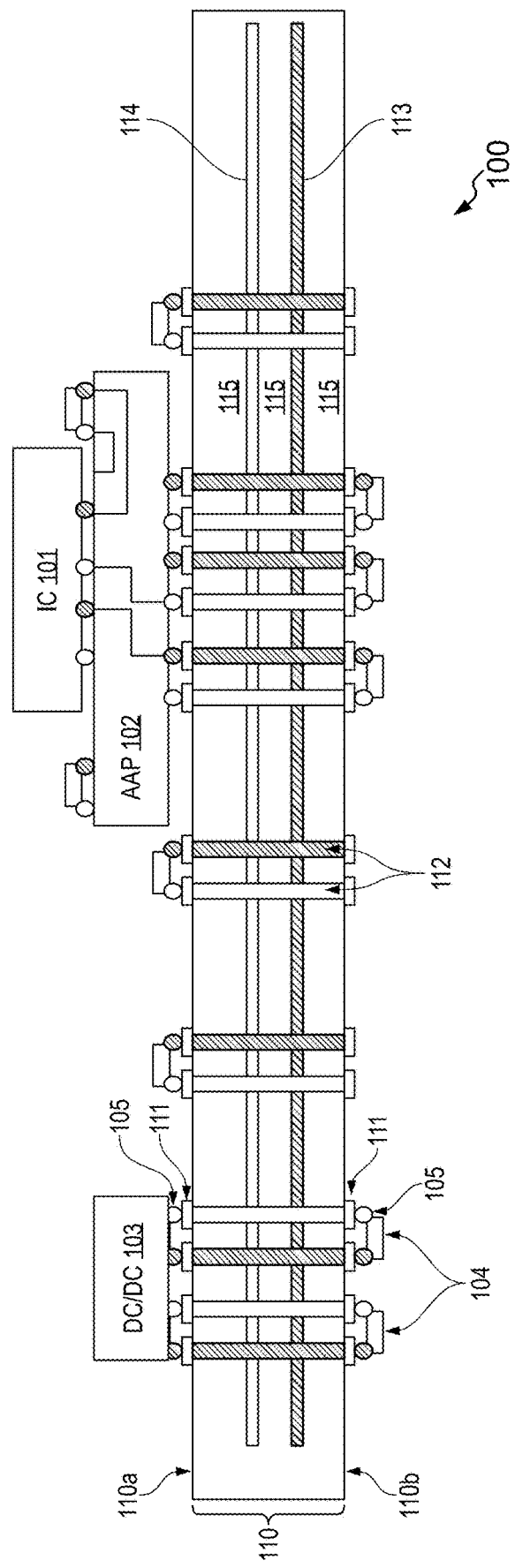
FIG. 1 illustrates a schematic representation of a printed circuit board assembly (PCBA) configured using a conventional power distribution network (PDN) following standard printed circuit board (PCB) guideline approaches.
Figure 2A:
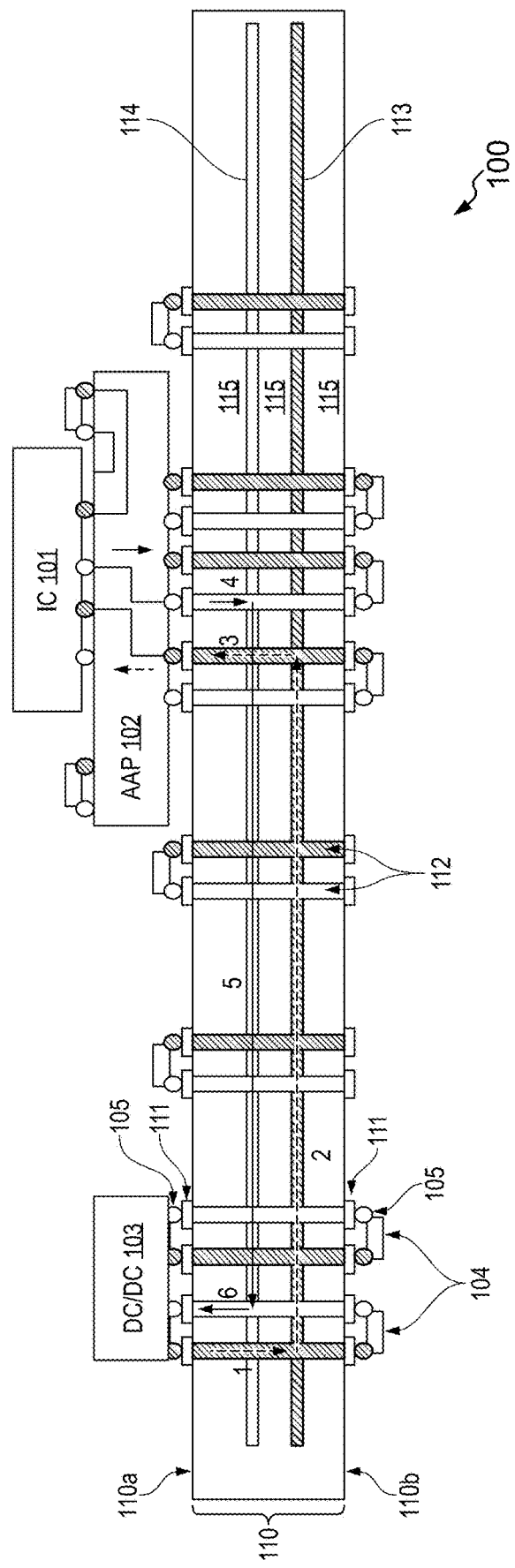
FIG. 2A illustrates a schematic representation of the PCBA depicting the current distribution in the PCB configured using the conventional power distribution network (PDN) following the standard PCB design guideline approaches.
Figure 2B:
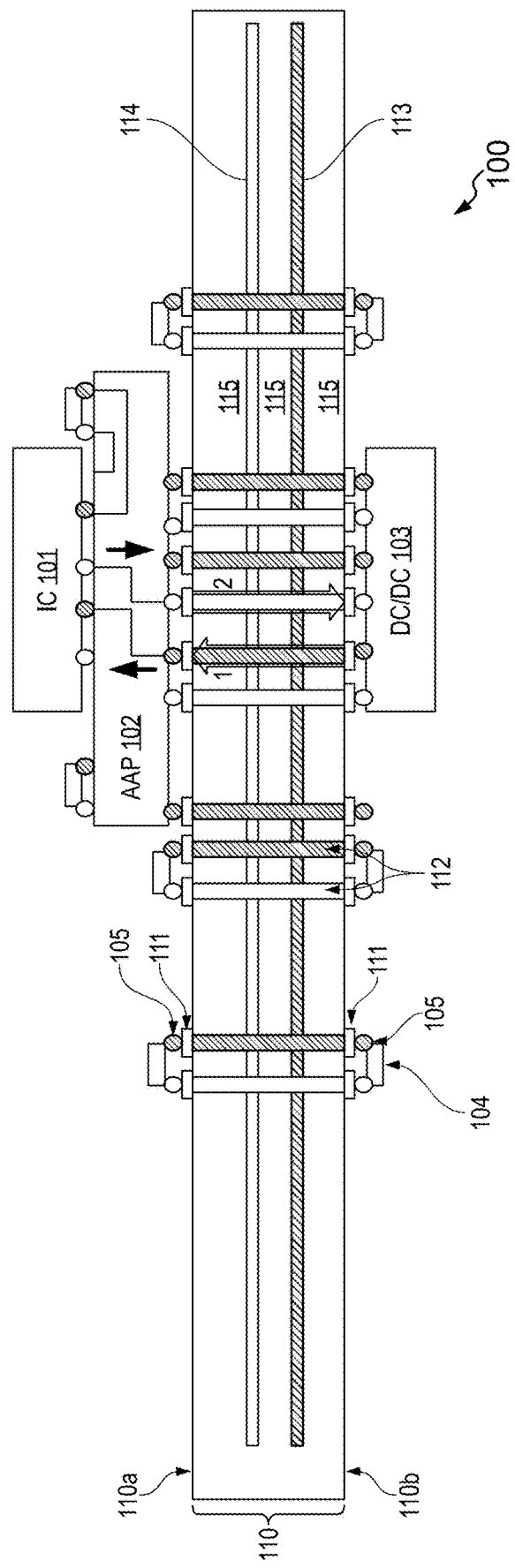
FIG. 2B illustrates a schematic representation of the PCBA depicting the current distribution in the PCB configured using a vertical power distribution network (PDN) following the standard PCB design guideline approaches.

This configuration significantly reduces the horizontal current flow path over the at least one power plane 313 or the at least one ground plane 314. Further, the number of the set of first terminals 320/the set of second terminals 320 and the associated at least one conductive path 312 are 1:2, so the cross-sectional current carrying area of the at least one conductive path 312 is doubled and opens the bottleneck for the vertical current flows as compared to the approaches discussed with reference to FIGS. 1, 2A, and 2B.

As explained above, the present disclosure provides a solution to accommodate more than one PTH via (or the conductive path) for at least each first terminal of the set of first terminals 320 and each second terminal of the set of second terminals 321. One of the important design and manufacturing parameters for PTH via (or the conductive path) is via-to-via spacing. The via-to-via spacing determines the number of the PTH vias (or the conductive paths) in a fixed area of the PCB 310. The via-to-via spacing corresponds to the set of spacing rules. The set of spacing rules may include three level spacing rules which will be explained with reference to FIGS. 5A and 5B.

Figure 5A:
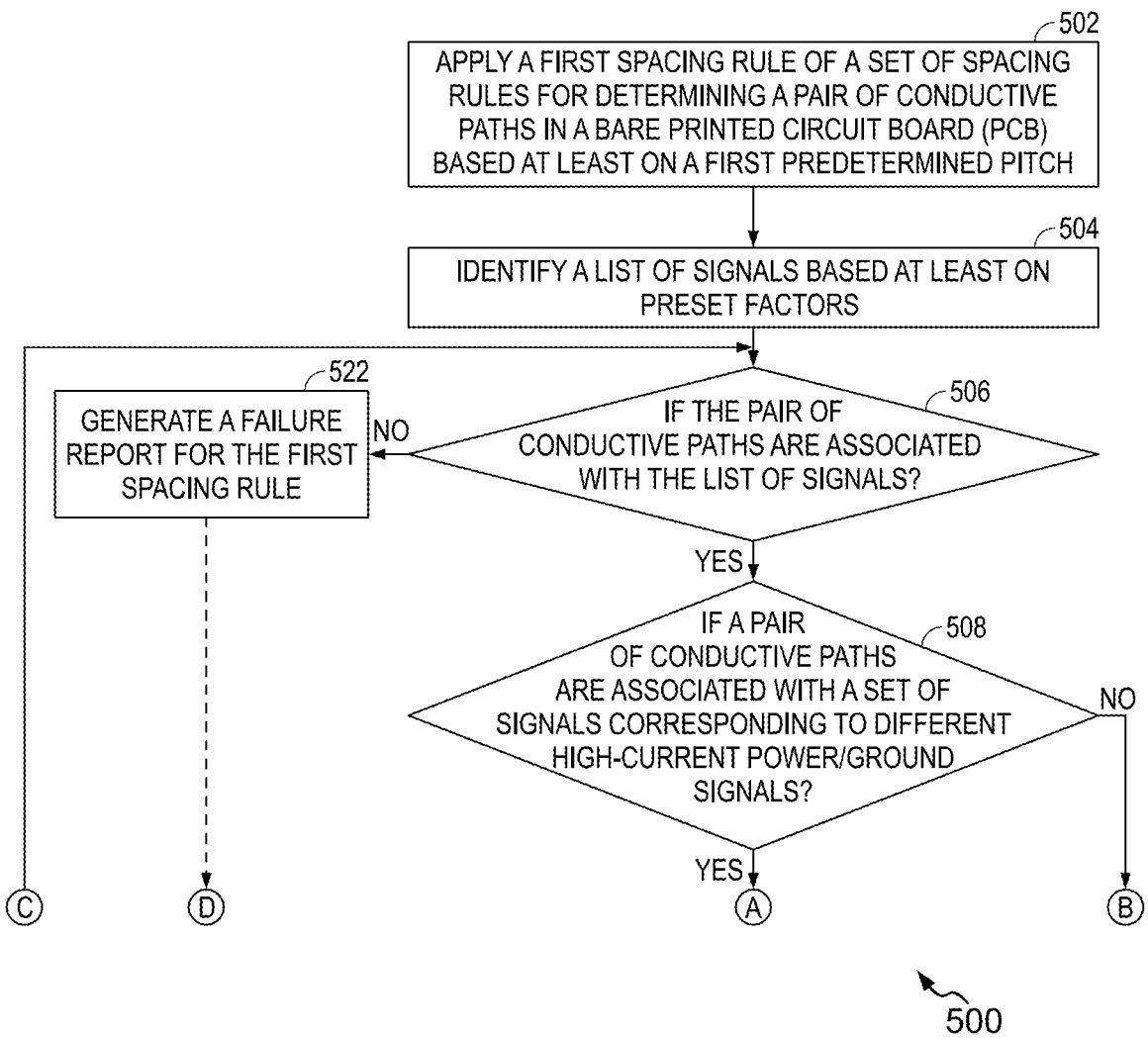
FIGS. 5A and 5B collectively illustrate a flowchart depicting a method for applying a set of spacing rules to determine a number of conductive paths in the printed circuit board assembly (PCBA), in accordance with an embodiment of the present disclosure.
Figure 5B:
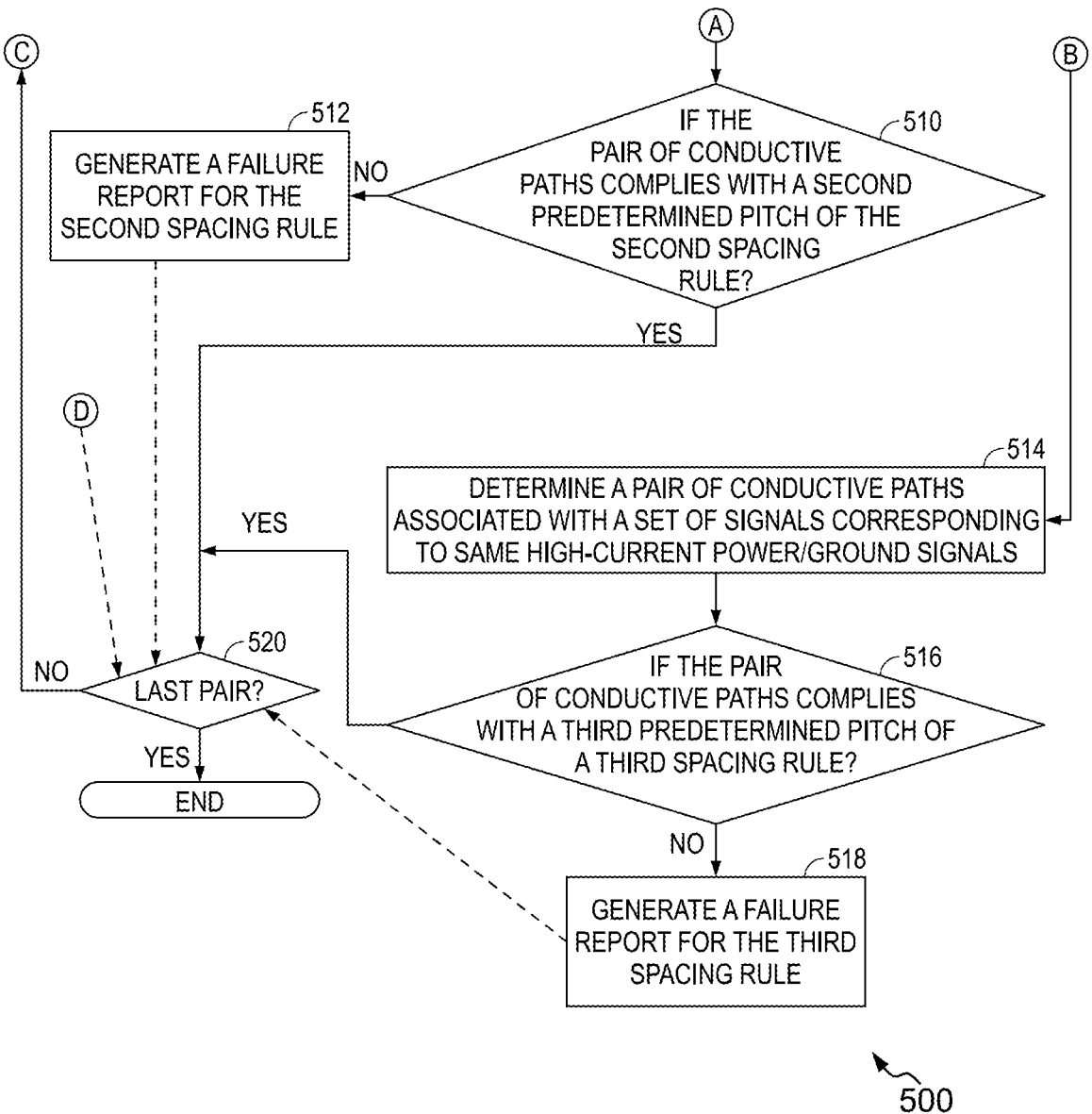

FIGS. 5A and 5B collectively illustrate a flowchart depicting a method 500 for applying the set of spacing rules to determine the number of conductive paths in the PCB 300, in accordance with an embodiment of the present disclosure. The set of spacing rules is related to distance between two conductive paths which are all pairs of conductive paths in the PCB 310. The pair of conductive paths in the PCB 310 are associated with the set of first terminals 320 and the set of second terminals 321. In other words, the pair of conductive paths determined by applying the set of spacing rules corresponds to the at least one conductive path 312 associated with at least the set of first terminals 320 and the set of second terminals 321. The method 500 starts at step 502.

At 502, a first spacing rule of the set of spacing rules is applied for all conductive paths in the PCB 310. The first spacing rule is applied based on a first predetermined pitch between each pair of conductive paths in the PCB 310. The pair of conductive paths determined based on the first spacing rule corresponds to the at least one conductive path 312. It is to be noted that the first spacing rule is applied for all the conductive paths with a drill hole size (DHS) irrespective of signal properties. For illustration purposes, a DHS of a conductive path is represented as 'D' (as shown in FIG. 3D), where 'D' is a non-negative number.

At 504, a list of signals is identified based at least on preset factors. Herein, the preset factors correspond to factors defined for identifying the high-current power/ground signals. In an embodiment, the list of signals may be identified if the pair of conductive paths in the PCB 310 violate the first spacing rule. For example, the list of signals may be high-current power/ground signals. The definition of the high-current power/ground signals can be subjective and based on the application cases. In one example scenario, the top 3 highest current power signals and associated ground signals may be selected as the list of signals. In another example scenario, all power/ground signals with more than 100 amperes (A) may be selected as the list of signals. Thereafter, a second spacing rule of the set of spacing rules is applied for determining the pair of conductive paths complying with the second spacing rule. In one example, the pair of conductive paths may be associated with the set of first terminals 320. In another example, the pair of conductive paths may be associated with the set of second terminals 321. In another example, one conductive path of the pair of conductive paths may be associated with the set of first terminals 320 and another conductive path of the pair of conductive paths may be associated with the set of second terminals 321. One or more operations of the second spacing rule are explained concerning steps 506, 508, and 510.

Thereafter, determine if the pair of conductive paths are associated with the list of signals that are selected based on the preset factors (see, 506). In one scenario, upon determining the pair of conductive paths are associated with the list of signals (i.e., high-current power/ground signals), step 508 is performed. In another scenario, if the pair of conductive paths are not associated with the list of signals (i.e., the high-current power/ground signals), step 522 is performed. At 522, a failure report is generated for the first spacing rule to include the pair of conductive paths violating the first spacing rule (or the first predetermined pitch).

At 508, check if a pair of conductive paths are associated with a set of signals corresponding to different high-current power/ground signals. The set of signals of the different high-current power/ground signals may be determined from the list of signals. Herein, the term 'the different high-current power/ground signals' relates to the pair of conductive paths being associated with the different set of first terminals 320 or set of second terminals 321. For example, one high-current power signal may be associated with a first terminal A and another high-current power signal may be associated with a first terminal B. It is to be noted that a conductive path associated with the first terminal A and a conductive path associated with the first terminal B are different. Hence, the two conductive paths (or the pair of conductive paths) associated with the different power terminals (such as the first terminal A and the first terminal B) are considered as the pair of conductive paths associated with the set of signals corresponding to the different high-current power signals. Similarly, the pair of conductive paths associated with the different high-current ground signals are determined.

Further, determining whether the pair of conductive paths complies with a second predetermined pitch P2 (in FIG. 3D) defined for the second spacing rule (see, 510). The pair of conductive paths determined based on the second spacing rule corresponds to the at least one conductive path 312. It is to be noted that upon determining the pair of conductive paths are associated with the set of signals corresponding to the different high-current power/ground signals, step 510 is performed. If the pair of conductive paths are not associated with the set of signals corresponding to the different high-current power/ground signals, step 514 is performed.

In one scenario, if the pair of conductive paths complies with the second predetermined pitch, step 520 is performed. In another scenario, if the pair of conductive paths violates the second predetermined pitch P2 (in FIG. 3D), step 512 is performed. At 512, a failure report is generated for the second spacing rule to include the pair of conductive paths violating the second predetermined pitch.

At 514, determining a pair of conductive paths associated with a set of signals corresponding to same high-current power/ground signals. The set of signals of the same high-current power/ground signals may be determined from the list of signals. Herein, the term 'the same high-current power/ground signals' relates to the pair of conductive paths being associated with the same set of first terminals 320 or set of second terminals 321. For example, one high-current power signal may be associated with a first terminal A, and another high-current power signal may be associated with a second terminal A. It is to be noted that the pair of conductive paths are associated with the first terminal A and the second terminal A. Hence, the two conductive paths (or the pair of conductive paths) associated with the same power terminals are considered as the pair of conductive paths associated with the set of signals corresponding to the same high-current power signals.

Based on determining the pair of conductive paths associated with the set of signals corresponding to the same high-current power/ground signals, determining whether the pair of conductive paths complies a third predetermined pitch P3 (in FIG. 3D) defined for a third spacing rule (see, 516). The pair of conductive paths determined based on the third spacing rule corresponds to the at least one conductive path 312. In one scenario, if the pair of conductive paths complies with the third predetermined pitch, step 520 is performed. At 520, determine if the pair of conductive paths is the last pair of a total number of the pair of conductive paths. If the pair of conductive paths is the last pair, the flowchart of the method 500 ends, else steps 506-522 are reiterated. Further, if the pair of conductive paths violates the third predetermined pitch P3 (in FIG. 3D), step 518 is performed. At 518, a failure report is generated for the third spacing rule to include the pair of conductive paths violating the third predetermined pitch.

In an embodiment, the first predetermined pitch, the second predetermined pitch, and the third predetermined pitch may be defined as a distance from the center of a conductive path of the pair of conductive paths to the center of another conductive path of the pair of conductive paths. In another embodiment, the first predetermined pitch, the second predetermined pitch, and the third predetermined pitch may be defined as minimal drill edge to drill edge. As explained above, each conductive path of the at least one conductive path 312 is a plated-through-hole (PTH) via.

Generally, the at least one conductive path 312 is configured in the PCB 310 using conventional techniques such as drilling. Hence, each conductive path (such as the at least one conductive path 312) is configured with the drill hole size (DHS). The DHS indicates a diameter of each conductive path. For example, the DHS of each conductive path of the at least one conductive path 312 may be 10 mils.

In one scenario, for the conductive paths associated with regular signals which are not a part of the identified high-current power/ground signals (i.e., the first spacing rule), a pad size (diameter) is 20 mils and an air gap is 5 mils, so an anti-pad size is 30 mils. Herein the anti-pad size corresponds to the first predetermined pitch. Hence, the first predetermined pitch defined for the first spacing rule is 30 mils. For illustration purposes, an anti-pad of the at least one conductive path 312 is exemplarily represented as 'A' (as shown in FIG. 3C).

In another scenario, for each conductive path of the pair of conductive paths of the at least one conductive path 312 associated with the set of signals corresponding to the different high-current power/ground signals, the second predetermined pitch defined for the second spacing rule may be 18 mils. The second predetermined pitch between the pair of conductive paths is exemplarily represented as 'P2' (as shown in FIG. 3D). The second predetermined pitch of 18 mils is the sum of the DHS (10 mils) of each conductive path and a predefined distance (8 mils) between each conductive path. The predefined distance of 8 mils is defined for the second spacing rule to prevent short between conductive paths in the PCB 310.

In another scenario, for each conductive path of the pair of conductive paths of the at least one conductive path 312 associated with the set of signals corresponding to the same high-current power/ground signals, the third predetermined pitch defined for the third spacing rule may be 16 mils. The third predetermined pitch between the pair of conductive paths is exemplarily represented as 'P3' (as shown in FIG. 3D). The third predetermined pitch of 16 mils is the sum of the DHS (10 mils) of each conductive path and a predetermined distance (6 mils) between each conductive path. The predetermined distance of 6 mils is defined for the third spacing rule to configure more conductive paths in the PCB 310. Further, it is low-risk or acceptable for two conductive paths shorting together if the two conductive paths are on the set of signals associated with the second signal property (i.e., the same high-current power/ground signals). In another scenario, the third predetermined pitch may be less than or equal to 10 mils, such that the two conductive paths touch or overlap each other.

Figure 6A:
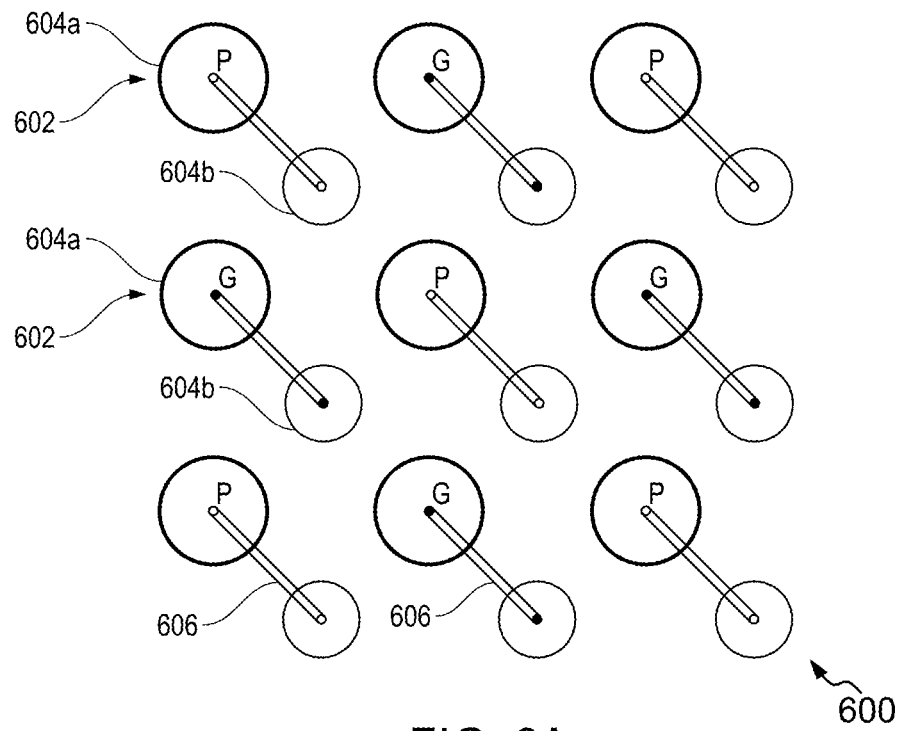
FIG. 6A illustrates an example representation of the printed circuit board assembly (PCBA) depicting a plurality of component pads electrically connected to each first terminal and each second terminal through via-in-pad configuration, in accordance with an embodiment of the present disclosure.

FIG. 6A illustrates an example representation of a PCB 600 depicting a plurality of component pads 602 electrically connected to conductive paths associated with each first terminal and each second terminal through via-in-pad configuration, in accordance with an embodiment of the present disclosure. In this configuration, a set of first terminals (power pins) of the PCB 600 is represented with a reference sign 'P', and a set of second terminals (ground pins) of the PCB 600 is represented with a reference sign 'G'. Herein, 'P' indicates the power pins (or the set of first terminals) of the PCB 600, and 'G' indicates the ground pins (or the set of second terminals) of the PCB 600. The set of first terminals 'P' and the set of second terminals 'G' are arranged in a square pattern. Further, the plurality of component pads 602 includes at least one primary component pad 604a and at least one secondary component pad 604b. As explained above, the at least one primary component pad 604a connects at least one primary conductive path (e.g., the at least one primary conductive path 312a) to the corresponding first terminal 'P' or the corresponding second terminal 'G'. Similarly, the at least one secondary component pad 604b connects at least one secondary conductive path (e.g., the at least one secondary conductive path 312b) to the corresponding first terminal 'P' or the corresponding second terminal 'G'. The at least one primary conductive path and the at least one secondary conductive path are not depicted in FIG. 6A. However, it should be noted that the at least one primary conductive path and the at least one secondary conductive path being electrically connected to the at least one primary component pad 604a and the at least one secondary component pad 604b are arranged in square pattern. For example, the at least one primary component pad may be 20 mils, and the at least one secondary component pad 604b may be 14 mils. Further, the number of the primary component pads 604a and the secondary component pads 604b is directly proportional to the number of conductive paths.

In the via-in-pad configuration, the primary component pad 604a is directly placed on each first power terminal 'P' and each second ground terminal 'G'. Thus, the at least one primary component pad 604a overlaps the set of first terminals 'P' and the set of second terminals 'G'. For illustration purposes, the overlapping of the at least one primary component pad 604a on each first terminal 'P' and each second terminal 'G' is depicted using 'bold line thickness'. The at least one secondary conductive pad 604b is placed at a distance from the at least one primary component pad 604a. The at least one secondary conductive pad 604b is electrically connected to each first terminal 'P' and each second terminal 'G' using a conductive feature 606. The conductive feature 606 may be copper traces.

Figure 6B:
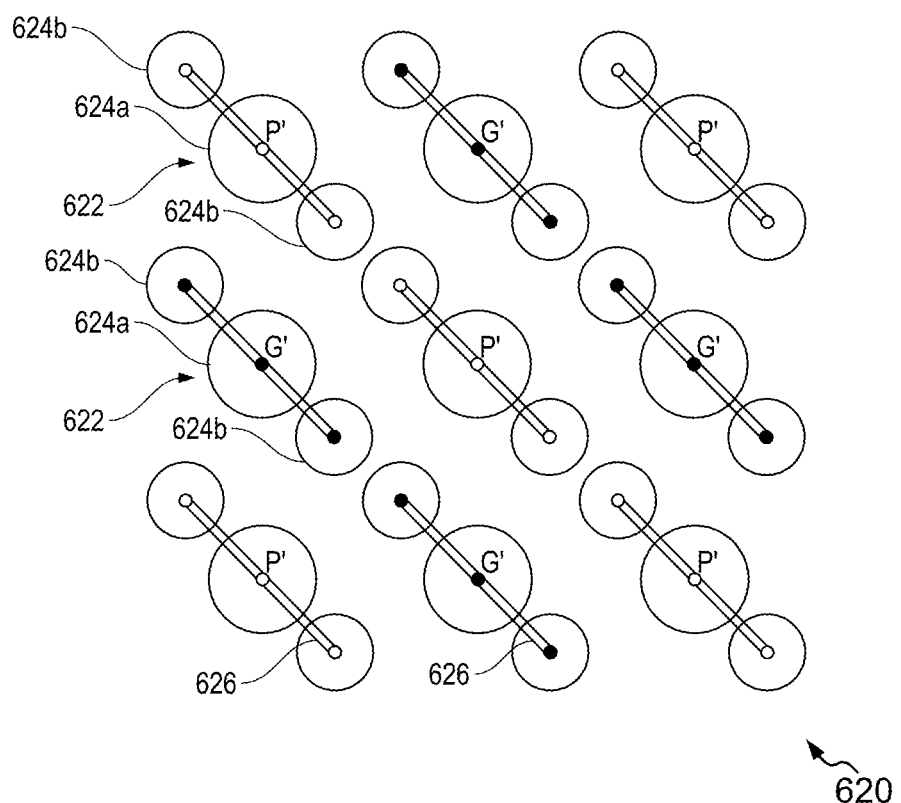
FIG. 6B illustrates an example representation of the printed circuit board assembly (PCBA) depicting the plurality of component pads electrically connected to each first terminal and each second terminal through dog-bone fan-out configuration, in accordance with an embodiment of the present disclosure.

FIG. 6B illustrates an example representation of a PCB 620 depicting a plurality of component pads 622 electrically connected to conductive paths associated with each first terminal and each second terminal through dog-bone fan-out configuration, in accordance with an embodiment of the present disclosure. In this configuration, a set of first terminals of the PCB 620 is represented with a reference sign P', and a set of second terminals of the PCB 620 is represented with a reference sign G'. Herein, P' indicates the power pins (or the set of first terminals) of the PCB 600, and G' indicates the ground pins (or the set of second terminals) of the PCB 620. The set of first terminals P' and the set of second terminals G' are arranged in a square pattern. Further, the plurality of component pads 622 includes at least one primary component pad 624a and at least one secondary component pad 624b. For example, the set of first terminals P' and the set of second terminals G' may be 20 mils. The at least one primary component pad 624a and the at least one secondary component pad 624b may be 14 mils. Further, the number of the primary component pads 624a and the secondary component pads 624b are directly proportional to the number of conductive paths.

In this configuration, the at least one primary component pad 624a is electrically connected to (or placed on) the corresponding first terminal 'P'' and the corresponding second terminal 'G''. Further, the at least one secondary component pad 624b is electrically connected to at least one primary conductive path (e.g., the at least one primary conductive path 312a) and at least one secondary conductive path (e.g., the at least one secondary conductive path 312b) associated with each first terminal 'P'' and the corresponding second terminal 'G''. Hence, the at least one primary conductive path and the at least one secondary conductive path are placed at the distance from the corresponding first terminal P' and the corresponding second terminal G'. The at least one primary conductive path and the at least one secondary conductive path are not depicted in FIG. 6B. However, it should be noted that the at least one primary conductive path and the at least one secondary conductive path being electrically connected to the at least one secondary component pad 604b are arranged in square pattern. The at least one secondary conductive pad 624b is placed at a distance from the at least one primary component pad 604a. For example, the at least one primary component pad 624a, and the at least one secondary component pad 624b may be placed at the distance of 19 mils from the center of the corresponding first terminal P' and the corresponding second terminal G'. Hence, the at least one primary conductive path and the at least one secondary conductive path are placed at the distance of 19 mils from the center of the corresponding first terminal P' and the corresponding second terminal G'. Further, the at least one secondary conductive pad 624b is electrically connected to the at least one primary conductive pad 624a being connected to the corresponding first terminal 'P' and the corresponding second terminal 'G' through a conductive feature 626. The conductive feature 626 may be copper traces Additionally, other design parameters may be optimized for enabling more PTH via (i.e., the at least one conductive path 312) per BGA power/ground pins (i.e., the set of first terminals 320 and the set of second terminals 321). The other design parameters may include a drill size, plating thickness, the plurality of component pads, anti-pad size, inner layer component pad size, and the like. The detailed explanation of the other design parameters is mentioned below.

Drill aspect ratio: A total thickness of the PCB 310 divided by the DHS of each conductive path of the at least one conductive path 312 is known as drill or plating aspect ratio. For example, the total thickness of the PCB 310 is 100 mils and the DHS is 10 mils, thus the drill or plating aspect ratio is 10:1. Further, minimum DHS is generally determined by the drilling and subsequent plating capability of the PCB fabricator. Hence, the smaller the DHS, the more PTH vias (or the conductive paths) may be accommodated in a fixed area of the PCB 310. However, the smaller DHS includes less copper cross-section area which is not recommended for optimum power delivery. Thus, for the same number of conductive paths, it is recommended to have a larger DHS to maximize the copper area.

Plating thickness: The plating thickness refers to the layer of a conductive material (e.g., copper) deposited onto the walls of each conductive path, or surface during the PCB manufacturing process. This plating ensures reliable electrical conductivity and structural integrity between layers (such as the power plane 313 and the ground plane 314) of the PCB 310. For example, the plating thickness may be 1 mil for each conductive path. From an electrical performance perspective, it is preferred to have more plating thickness and even fill the conductive material inside each conductive path to reduce the resistance.

The plurality of component pads 311 is usually determined based on connection configuration such as the via-in-pad configuration or the dog-bone fan-out configuration. Some non-limiting examples of the plurality of component pads 311 may include solder pads, external layer conductive path pads, and internal layer conductive path pads. The solder pads may be provided on external layers of the PCB (such as the PCB 310) for soldering other components, such as the IC (see, 301 of FIG. 3A). The external layer conductive path pads are on top and bottom of the at least one conductive path 312. The external layer conductive path pads are required for platting of the at least one conductive path 312 and mechanical reliability. In the via-in-pad configuration, the component pads include the solder pads and the external layer conductive path pads. The inner layer conductive path pads are used for the at least one conductive path associated with the set of third terminals.

Inner layer anti-pad size: For conventional designs, the power/ground anti-pad size (diameter) is determined as the sum of the DHS and a radial air gap (no copper) registration tolerance. For example, 10 mil radial air gap is added to the 10 mil DHS for 20 mil component pad, so the anti-pad size is 30 mil. However, for the PCB 310, the extra via(s) to be added is on the same net as the original via so a smaller anti-pad size can be used. For example, 7 mil radial air gap is added the 10 mil DHS, so the anti-pad size is 24 mil. The smaller Power/Ground anti-pad size is critical for having more PTH vias and keeping more copper plane areas, so it is strongly recommended to keep the Power/Ground anti-pad as small as possible within manufacturing capabilities.

In one example scenario, for conductive paths associated with the signal pins connecting to inner layer component pads, an anti-pad size is listed below:
Signal layer: the size of the inner layer component pad on the signal layer is determined by the DHS (D) and the registration tolerance. For example, 10 mils DHS (D) with 4 mils radial registration tolerance (D+4) requires an 18 mils anti-pad size.
Power/Ground layer: Copper is removed on all the power and ground planes to form an anti-pad to prevent the conductive paths of the signal layer from shorting with the power/ground planes. In this scenario, the anti-pad size is dependent on the same DHS and a typical anti-pad registration tolerance on the power/ground layers. For example, 10 mils DHS (D) with 8 milradial registration tolerance (D+8) requires a 26 mil anti-pad size.

In another example scenario, for conductive paths associated with the power pins connecting to the corresponding power inner layers, an anti-pad size is listed below:
Signal layer: remove all non-functional pads on the signal layers.
Ground layer: D+8 anti-pad size on the power layers.
Power layer: The conductive paths associated with the power pins drilled through the power planes.

In another example scenario, for conductive paths associated the ground pins connecting to the corresponding ground (GND) layers, an anti-pad size is listed below:
Signal layer: remove all non-functional pads on the power/ground layers.
Ground layer: The conductive paths drilled through the ground planes.
Power layer: D+8 anti-pad size on the ground layers.

Figure 7:
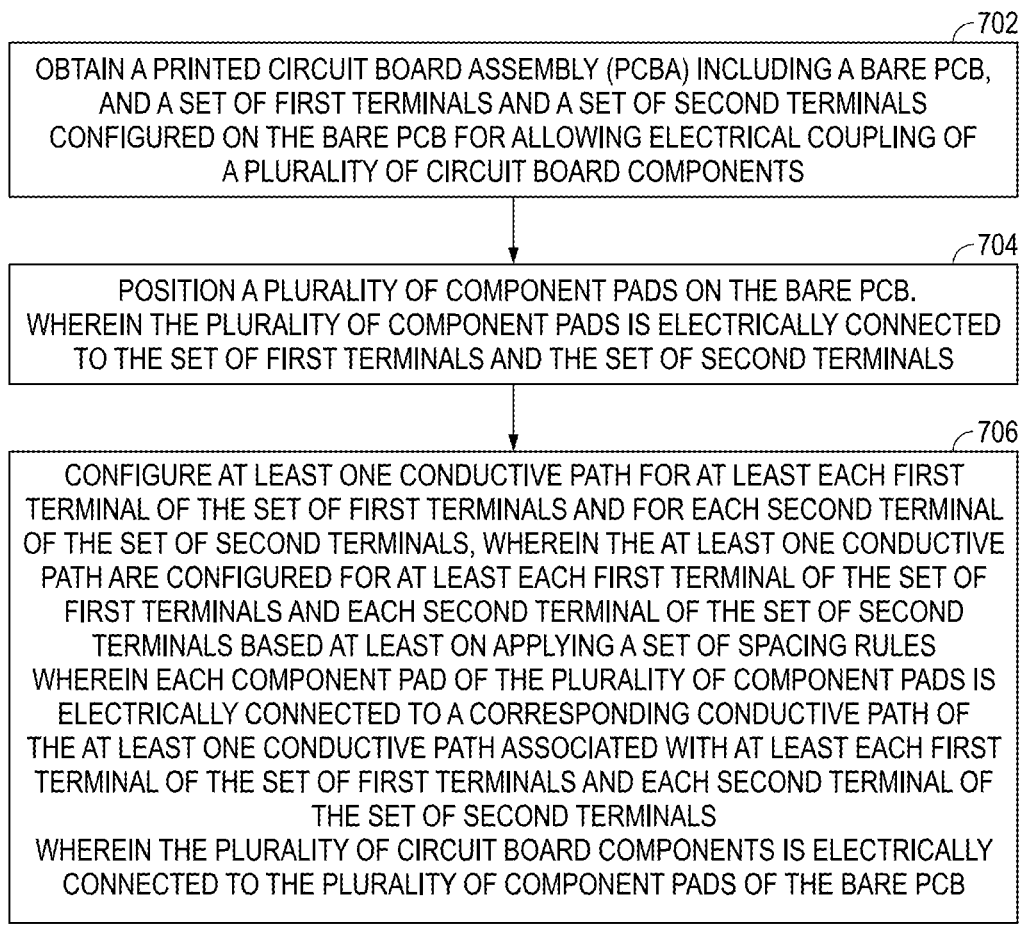
FIG. 7 illustrates a flow diagram of a method for configuring conductive paths in the printed circuit board assembly (PCBA), in accordance with an embodiment of the present disclosure.

FIG. 7 illustrates a flow diagram of a method 700 for configuring conductive paths in a printed circuit board assembly (PCBA), in accordance with an embodiment of the present disclosure. The method 700 starts at operation 702.

At operation 702, the method 700 includes obtaining a printed circuit board assembly (PCBA) including a bare PCB, and a set of first terminals and a set of second terminals configured on the PCB for allowing electrical coupling of a plurality of circuit board components.

At operation 704, the method 700 includes positioning a plurality of component pads on the bare PCB. The plurality of component pads is electrically connected to the set of first terminals and the set of second terminals.

At operation 706, the method 700 includes configuring at least one conductive path for at least each first terminal of the set of first terminals and for each second terminal of the set of second terminals. The at least one conductive path are configured for at least each first terminal of the set of first terminals and each second terminal of the set of second terminals based at least on applying a set of spacing rules. Further, each component pad of the plurality of component pads is electrically connected to a corresponding conductive path of the at least one conductive path associated with at least each first terminal of the set of first terminals and each second terminal of the set of second terminals. Furthermore, the plurality of circuit board components is electrically connected to the plurality of component pads of the bare PCB. Further, the one or more operations for configuring conductive paths in a printed circuit board (PCB) are already explained with reference to FIG. 1 to FIGS. 6A-6B, therefore they are not reiterated herein for the sake of brevity.

Various embodiments of the disclosure, as discussed above, may be practiced with steps and/or operations in a different order, and/or with hardware elements in configurations, which are different than those which, are disclosed. Therefore, although the disclosure has been described based on these exemplary embodiments, it is noted that certain modifications, variations, and alternative constructions may be apparent and well within the spirit and scope of the disclosure.

Although various exemplary embodiments of the disclosure are described herein in a language specific to structural features and/or methodological acts, the subject matter defined in the appended claims is not necessarily limited to the specific features or acts described above. Rather, the specific features and acts described above are disclosed as exemplary forms of implementing the claims.

The invention claimed is:

1. A system, comprising:
a processor; and
a memory coupled to the processor and configured to provide the processor with instructions which when executed cause the processor to:
  obtain a representation of a printed circuit board assembly (PCBA) that includes a bare printed circuit board (PCB) comprising one or more copper layers and one or more dielectric layers; and
  generate a representation of a connected PCBA based on the bare PCB, including by:
    positioning a set of voltage supply terminals and a set of ground terminals that are associated with supplying power to a plurality of circuit board components;
    positioning a plurality of component pads, wherein a component pad in the plurality of component pads is electrically connected to either (1) at least one voltage supply terminal in the set of voltage supply terminals or (2) at least one ground terminal in the set of ground terminals, but not to both;
    configuring, based at least in part on a set of via-to-via spacing rules, a plurality of conductive paths, including:
      at least one voltage supply conductive path between a first voltage supply terminal and a second voltage supply terminal in the set of voltage supply terminals;
      at least one ground conductive path between a first ground terminal and a second ground terminal in the set of ground terminals; and
      at least one data conductive path associated with data communication; and
    electrically connecting at least some of the plurality of circuit board components to at least some of the plurality of component pads, via at least some of the set of voltage supply terminals and via at least some of the set of ground terminals.

2. The system recited in claim 1, wherein:
the set of via-to-via spacing rules includes (1) an initial subset of via-to-via spacing rules and (2) a second subset of via-to-via spacing rules with closer via-to-via spacing than is permitted by the initial subset of via-to-via spacing rules; and
configuring, based at least in part on the set of via-to-via spacing rules, the plurality of conductive paths, further includes:
  initially applying, independent of a signal property associated with a pair of conductive paths being evaluated, the initial subset of via-to-via spacing rules to the pair of conductive paths being evaluated;
  in the event the pair of conductive paths being evaluated violates the initial subset of via-to-via spacing rules, determining whether the pair of conductive paths being evaluated is associated with a high-current power/ground signal;
  in the event the pair of conductive paths being evaluated is determined to be associated with a high-current power/ground signal, applying the second subset of via-to-via spacing rules to the pair of conductive paths being evaluated; and
  in the event the pair of conductive paths being evaluated is determined to not be associated with a high-current power/ground signal, generating a failure report for the pair of conductive paths being evaluated for violating the initial subset of via-to-via spacing rules.

3. The system recited in claim 2, wherein determining whether the pair of conductive paths being evaluated is associated with a high-current power/ground signal includes one or more of the following: selecting a plurality of top highest current power signals and associated ground signals, or using a threshold associated with a current level.

4. The system recited in claim 2, wherein:
the second subset of via-to-via spacing rules is associated with different high-current power/ground signals;
the set of via-to-via spacing rules further includes a third subset of via-to-via spacing rules that is associated with same high-current power/ground signals with closer via-to-via spacing than is permitted by the second subset of via-to-via spacing rules; and
configuring, based at least in part on the set of via-to-via spacing rules, the plurality of conductive paths, further includes:
  determining whether the pair of conductive paths being evaluated is associated with same high-current power/ground signals or different high-current power/ground signals;
  in the event it is determined that the pair of conductive paths being evaluated is associated with different high-current power/ground signals, applying the second subset of via-to-via spacing rules to the pair of conductive paths being evaluated; and
  in the event it is determined that the pair of conductive paths being evaluated is associated with same high-current power/ground signals, applying the third subset of via-to-via spacing rules to the pair of conductive paths being evaluated.

5. The system recited in claim 1, wherein the set of via-to-via spacing rules includes at least one spacing rule associated with a pitch between a first center of a first drill hole and a second center of a second drill hole.

6. The system recited in claim 1, wherein at least one of the following includes a plated-through-hole (PTH) via: the at least one voltage supply conductive path, the at least one ground conductive path, or the at least one data conductive path.

7. The system recited in claim 1, wherein the plurality of circuit board components includes one or more of the following: an integrated circuit (IC), an application specific integrated circuit (ASIC), an area array package (AAP), a direct current (DC)-to-direct current (DC) converter, a switching power supplier, a low dropout (LDO) power supplier, a socket, a connector, or a discrete component.

8. A method, comprising:
   obtaining a representation of a printed circuit board assembly (PCBA) that includes a bare printed circuit board (PCB) comprising one or more copper layers and one or more dielectric layers; and
   generating a representation of a connected PCBA based on the bare PCB, including by:
      positioning a set of voltage supply terminals and a set of ground terminals that are associated with supplying power to a plurality of circuit board components;
      positioning a plurality of component pads, wherein a component pad in the plurality of component pads is electrically connected to either (1) at least one voltage supply terminal in the set of voltage supply terminals or (2) at least one ground terminal in the set of ground terminals, but not to both;
      configuring, based at least in part on a set of via-to-via spacing rules, a plurality of conductive paths, including:
         at least one voltage supply conductive path between a first voltage supply terminal and a second voltage supply terminal in the set of voltage supply terminals;
         at least one ground conductive path between a first ground terminal and a second ground terminal in the set of ground terminals; and
         at least one data conductive path associated with data communication; and
      electrically connecting at least some of the plurality of circuit board components to at least some of the plurality of component pads, via at least some of the set of voltage supply terminals and via at least some of the set of ground terminals.

9. The method recited in claim 8, wherein:
   the set of via-to-via spacing rules includes (1) an initial subset of via-to-via spacing rules and (2) a second subset of via-to-via spacing rules with closer via-to-via spacing than is permitted by the initial subset of via-to-via spacing rules; and
   configuring, based at least in part on the set of via-to-via spacing rules, the plurality of conductive paths, further includes:
      initially applying, independent of a signal property associated with a pair of conductive paths being evaluated, the initial subset of via-to-via spacing rules to the pair of conductive paths being evaluated;
      in the event the pair of conductive paths being evaluated violates the initial subset of via-to-via spacing rules, determining whether the pair of conductive paths being evaluated is associated with a high-current power/ground signal;
      in the event the pair of conductive paths being evaluated is determined to be associated with a high-current power/ground signal, applying the second subset of via-to-via spacing rules to the pair of conductive paths being evaluated; and
      in the event the pair of conductive paths being evaluated is determined to not be associated with a high-current power/ground signal, generating a failure report for the pair of conductive paths being evaluated for violating the initial subset of via-to-via spacing rules.

10. The method recited in claim 9, wherein determining whether the pair of conductive paths being evaluated is associated with a high-current power/ground signal includes one or more of the following: selecting a plurality of top highest current power signals and associated ground signals, or using a threshold associated with a current level.

11. The method recited in claim 9, wherein:
   the second subset of via-to-via spacing rules is associated with different high-current power/ground signals;
   the set of via-to-via spacing rules further includes a third subset of via-to-via spacing rules that is associated with same high-current power/ground signals with closer via-to-via spacing than is permitted by the second subset of via-to-via spacing rules; and
   configuring, based at least in part on the set of via-to-via spacing rules, the plurality of conductive paths, further includes:
      determining whether the pair of conductive paths being evaluated is associated with same high-current power/ground signals or different high-current power/ground signals;
      in the event it is determined that the pair of conductive paths being evaluated is associated with different high-current power/ground signals, applying the second subset of via-to-via spacing rules to the pair of conductive paths being evaluated; and
      in the event it is determined that the pair of conductive paths being evaluated is associated with same high-current power/ground signals, applying the third subset of via-to-via spacing rules to the pair of conductive paths being evaluated.

12. The method recited in claim 8, wherein the set of via-to-via spacing rules includes at least one spacing rule associated with a pitch between a first center of a first drill hole and a second center of a second drill hole.

13. The method recited in claim 8, wherein at least one of the following includes a plated-through-hole (PTH) via: the at least one voltage supply conductive path, the at least one ground conductive path, or the at least one data conductive path.

14. The method recited in claim 8, wherein the plurality of circuit board components includes one or more of the following: an integrated circuit (IC), an application specific integrated circuit (ASIC), an area array package (AAP), a direct current (DC)-to-direct current (DC) converter, a switching power supplier, a low dropout (LDO) power supplier, a socket, a connector, or a discrete component.

15. A computer program product embodied in a non-transitory computer readable medium and comprising computer instructions for:
   obtaining a representation of a printed circuit board assembly (PCBA) that includes a bare printed circuit board (PCB) comprising one or more copper layers and one or more dielectric layers; and
   generating a representation of a connected PCBA based on the bare PCB, including by:

positioning a set of voltage supply terminals and a set of ground terminals that are associated with supplying power to a plurality of circuit board components;

positioning a plurality of component pads, wherein a component pad in the plurality of component pads is electrically connected to either (1) at least one voltage supply terminal in the set of voltage supply terminals or (2) at least one ground terminal in the set of ground terminals, but not to both;

configuring, based at least in part on a set of via-to-via spacing rules, a plurality of conductive paths, including:

at least one voltage supply conductive path between a first voltage supply terminal and a second voltage supply terminal in the set of voltage supply terminals;

at least one ground conductive path between a first ground terminal and a second ground terminal in the set of ground terminals; and at least one data conductive path associated with data communication; and electrically connecting at least some of the plurality of circuit board components to at least some of the plurality of component pads, via at least some of the set of voltage supply terminals and via at least some of the set of ground terminals.

16. The computer program product recited in claim 15, wherein:

the set of via-to-via spacing rules includes (1) an initial subset of via-to-via spacing rules and (2) a second subset of via-to-via spacing rules with closer via-to-via spacing than is permitted by the initial subset of via-to-via spacing rules; and configuring, based at least in part on the set of via-to-via spacing rules, the plurality of conductive paths, further includes:

initially applying, independent of a signal property associated with a pair of conductive paths being evaluated, the initial subset of via-to-via spacing rules to the pair of conductive paths being evaluated;

in the event the pair of conductive paths being evaluated violates the initial subset of via-to-via spacing rules, determining whether the pair of conductive paths being evaluated is associated with a high-current power/ground signal;

in the event the pair of conductive paths being evaluated is determined to be associated with a high-current power/ground signal, applying the second subset of via-to-via spacing rules to the pair of conductive paths being evaluated; and in the event the pair of conductive paths being evaluated is determined to not be associated with a high-current power/ground signal, generating a failure report for the pair of conductive paths being evaluated for violating the initial subset of via-to-via spacing rules.

17. The computer program product recited in claim 16, wherein determining whether the pair of conductive paths being evaluated is associated with a high-current power/ground signal includes one or more of the following: selecting a plurality of top highest current power signals and associated ground signals, or using a threshold associated with a current level.

18. The computer program product recited in claim 16, wherein:

the second subset of via-to-via spacing rules is associated with different high-current power/ground signals;

the set of via-to-via spacing rules further includes a third subset of via-to-via spacing rules that is associated with same high-current power/ground signals with closer via-to-via spacing than is permitted by the second subset of via-to-via spacing rules; and configuring, based at least in part on the set of via-to-via spacing rules, the plurality of conductive paths, further includes:

determining whether the pair of conductive paths being evaluated is associated with same high-current power/ground signals or different high-current power/ground signals;

in the event it is determined that the pair of conductive paths being evaluated is associated with different high-current power/ground signals, applying the second subset of via-to-via spacing rules to the pair of conductive paths being evaluated; and in the event it is determined that the pair of conductive paths being evaluated is associated with same high-current power/ground signals, applying the third subset of via-to-via spacing rules to the pair of conductive paths being evaluated.

19. The computer program product recited in claim 15, wherein at least one of the following includes a plated-through-hole (PTH) via: the at least one voltage supply conductive path, the at least one ground conductive path, or the at least one data conductive path.

20. The computer program product recited in claim 15, wherein the plurality of circuit board components includes one or more of the following: an integrated circuit (IC), an application specific integrated circuit (ASIC), an area array package (AAP), a direct current (DC)-to-direct current (DC) converter, a switching power supplier, a low dropout (LDO) power supplier, a socket, a connector, or a discrete component.

* * * * *